(12) United States Patent
Keane

(10) Patent No.: US 9,595,959 B2
(45) Date of Patent: Mar. 14, 2017

(54) RADIO FREQUENCY SWITCH WITH IMPROVED LINEARITY

(71) Applicant: FERFICS, LIMITED, Cork (IE)

(72) Inventor: John Keane, Cork (IE)

(73) Assignee: Ferfics Limited (IE)

( * ) Notice: Subject to any disclaimer, the term of this patent is extended or adjusted under 35 U.S.C. 154(b) by 0 days.

(21) Appl. No.: 14/019,869

(22) Filed: Sep. 6, 2013

(65) Prior Publication Data
US 2015/0070075 A1   Mar. 12, 2015

(51) Int. Cl.
*H03K 17/16*   (2006.01)
*H03K 17/693*   (2006.01)

(52) U.S. Cl.
CPC .................................. *H03K 17/693* (2013.01)

(58) Field of Classification Search
CPC ........... H01L 2924/00–2924/01; H03K 17/693
See application file for complete search history.

(56) References Cited

U.S. PATENT DOCUMENTS

| | | | |
|---|---|---|---|
| 6,194,948 B1* | 2/2001 | Scian et al. | 327/382 |
| 2014/0062575 A1* | 3/2014 | Hurwitz | H03K 17/161 327/379 |
| 2014/0227983 A1* | 8/2014 | Clausen et al. | 455/78 |
| 2014/0368899 A1* | 12/2014 | Greer | 359/275 |

* cited by examiner

*Primary Examiner* — Sibin Chen
(74) *Attorney, Agent, or Firm* — Tarolli, Sundheim, Covell & Tummino LLP

(57) ABSTRACT

A Radio Frequency (RF) switch element is described. The RF switch element comprises a primary transistor element for facilitating switching an RF signal between circuit nodes. A pair of secondary transistor elements are also provided. The pair of secondary transistor elements are co-operable with the primary transistor element and provide respective signal paths which have a lower impedance level than an intrinsic element associated with the primary transistor element.

17 Claims, 10 Drawing Sheets

RADIO FREQUENCY SWITCH WITH IMPROVED LINEARITY

FIELD OF THE INVENTION

The present teaching relates to a Radio Frequency (RF) switch with improved transistor stack linearity. In particular, the present teaching is directed to an RF switch which reduces sources of distortion in an RF transistor stack thereby increasing linearity performance.

BACKGROUND

The act of switching radio frequency signals in an integrated circuit is carried out by a Radio Frequency (RF) switch circuit. RF switches are well known in the art and provide a key building block in wireless systems. RF switches may be utilised in numerous applications such as mobile phones and wireless Local Area Networks (LANs). Such switches may include any number of switching elements which cooperate to control the flow of RF power between various circuit nodes. Performance metrics such as low insertion loss, high linearity, switching time, high isolation and power handling are critical in RF switch design. Generally an RF switch does not consist of the RF switching circuit alone. Typically an RF switch system is comprised of two domains; an RF domain which includes the switching elements and a Direct Current (DC) domain which includes control logic, bias generation and power management circuitry.

An RF switch may comprise any number of switching elements which control the flow of RF power between different points in the particular application. Generally, switching elements are comprised of transistors that are in a stacked configuration. The number of transistors in a stack is determined by the maximum RF voltage that can be developed across the complete stack and the maximum voltage that may be tolerated across an individual transistor without introducing limitations to either reliability or linearity performance of the device. RF ICs are subject to stringent linearity specifications which require tight limits on the level of distortion that a device may introduce on an RF signal. Linearity requirements may be expressed by specifying different parameters such as harmonics generation, intermodulation distortion (IMD2, IMD3) or intercept points, (IP2, IP3). Irrespective of how requirements are specified the linearity performance is determined by distortion introduced on RF signal by RF transistor stacks. Adoption of 4 G/LTE standards places ever increasing demands on linearity requirements of components such as RF switches. The RF transistor stack is becoming a limitation in achieving required linearity performance on SOI CMOS process.

There is therefore a need to provide an RF switch element which addresses at least some of the drawbacks of the prior art.

SUMMARY

These and other problems are addressed by providing an RF switch element which includes a primary transistor element for facilitating switching an RF signal between nodes, and a pair of secondary transistors elements which are configured to reduce intrinsic impedance imbalances associated with the primary transistor element.

In one aspect there is provided a radio frequency (RF) switch element comprising a primary transistor element for facilitating switching an RF signal between circuit nodes; and a pair of secondary transistor elements; wherein the pair of secondary transistor elements are co-operable with the primary transistor element and provide respective signal paths which have a lower impedance level than an intrinsic element associated with the primary transistor element.

In another aspect, a plurality of primary transistor elements are arranged in a stacked configuration. Preferably, each primary transistor element in the stacked configuration is associated with a pair of secondary transistor elements.

In a further aspect, the primary transistor element comprises four terminals. Ideally, the respective secondary transistor elements comprise four terminals. Preferably, the primary transistor element comprises a gate terminal, a source terminal, a drain terminal and a body terminal. Advantageously, the respective secondary transistor elements comprise a gate terminal, a source terminal, a drain terminal and a body terminal.

In one aspect, each pair of secondary transistor elements and the associated primary transistor element are biased in operation to be simultaneously in an on-state. Advantageously, each pair of secondary transistor elements and the associated primary transistor element are biased in operation to be simultaneously in an off-state.

In a further aspect, one of the secondary transistor elements is operably coupled between the drain terminal and the body terminal of the primary transistor element and provides a signal path with an impedance level which is lower than an intrinsic element located between the drain terminal and the body terminal of the primary transistor element. Advantageously, the other one of the secondary transistor elements is operably coupled between the body terminal and the source terminal of the primary transistor element and provides a signal path with an impedance level which is lower than an intrinsic element located between the body terminal and the source terminal of the primary transistor element.

In another aspect, the gates of the primary transistor element and the gates of the pair of secondary transistor elements are operably coupled to a common node. Preferably, each pair of secondary transistor elements are biased in operation to be in an on-state when the associated primary transistor element is in an off state. Ideally, each pair of secondary transistor elements are biased in operation to be in an off-state when the associated primary transistor element is in an on state.

In a further aspect, one of the secondary transistor elements is operably coupled between the gate terminal and the body terminal of the primary transistor element and provides a signal path with an impedance level which is lower than an intrinsic element located between the gate terminal and the body terminal of the primary transistor element. Advantageously, the other one of the secondary transistor elements is operably coupled between the gate terminal and the body terminal of the primary transistor element and provides a signal path with an impedance level which is lower than an intrinsic element located between the gate terminal and the body terminal of the primary transistor element.

In one aspect, the gate of one of the secondary transistor elements is operably coupled to the drain of the primary transistor element. Ideally, the gate of the other one of the secondary transistor elements is operably coupled to the source of the primary transistor element.

The present teaching is further directed to an RF switch element which comprises a primary transistor element for facilitating switching an RF signal between circuit nodes; and a first pair of secondary transistor elements and a second pair of secondary transistor elements; wherein the first pair of secondary transistor elements and the second pair of secondary transistor elements are co-operable with the primary transistor element and provide respective signal paths which have a lower impedance level than an intrinsic impedance element associated with the primary transistor element.

In one aspect, each first pair of secondary transistor elements and the associated primary transistor element are biased in operation to be simultaneously in an on-state. Advantageously, each first pair of secondary transistor elements and the associated primary transistor element are biased in operation to be simultaneously in an off-state.

In another aspect, one of the secondary transistor elements of the first pair is operably coupled between the drain terminal and the body terminal of the primary transistor element and provides a signal path with an impedance level which is lower than an intrinsic element located between the drain terminal and the body terminal of the primary transistor element. Advantageously, the other one of the secondary transistor elements of the first pair is operably coupled between the body terminal and the source terminal of the primary transistor element and provides a signal path with an impedance level which is lower than an intrinsic element located between the body terminal and the source terminal of the primary transistor element.

In another aspect, the gates of the primary transistor element and the gates of the first pair of secondary transistor elements are operably coupled to a common node. Advantageously, each second pair of secondary transistor elements are biased in operation to be in an on-state when the associated primary transistor element is in an off state. Ideally, each second pair of secondary transistor elements are biased in operation to be in an off-state when the associated primary transistor element is in an on state.

In a further aspect, one of the secondary transistor elements of the second pair is operably coupled between the gate terminal and the body terminal of the primary transistor element and provides a signal path with an impedance level which is lower than an intrinsic element located between the gate terminal and the body terminal of the primary transistor element. Advantageously, the other one of the secondary transistor elements of the second pair is operably coupled between the gate terminal and the body terminal of the primary transistor element and provides a signal path with an impedance level which is lower than an intrinsic element located between the gate terminal and the body terminal of the primary transistor element.

In one aspect, the gate of one of the secondary transistor elements of the second pair is operably coupled to the drain of the primary transistor element. Advantageously, the gate of the other one of the secondary transistor elements of the second pair is operably coupled to the source of the primary transistor element.

In one aspect there is provided a switch element comprising a primary transistor element for facilitating switching a signal between circuit nodes; and a pair of secondary transistor elements; wherein the pair of secondary transistor elements are co-operable with the primary transistor element and provide respective signal paths which have a lower impedance level than an intrinsic element associated with the primary transistor element.

In another aspect there is provided a switch element comprising a primary transistor element for facilitating switching a signal between circuit nodes; and a first pair of secondary transistor elements and a second pair of secondary transistor elements; wherein the first pair of secondary transistor elements and the second pair of secondary transistor elements are co-operable with the primary transistor element and provide respective signal paths which have a lower impedance level than an intrinsic impedance element associated with the primary transistor element.

These and other features will be better understood with reference to the followings Figures which are provided to assist in an understanding of the present teaching.

BRIEF DESCRIPTION OF THE DRAWINGS

The present teaching will now be described with reference to the accompanying drawings in which.

DETAILED DESCRIPTION OF THE DRAWINGS

The present teaching will now be described with reference to some exemplary radio frequency (RF) switches. It will be understood that the exemplary RF switches are provided to assist in an understanding of the present teaching and are not to be construed as limiting in any fashion. Furthermore, circuit elements or components that are described with reference to any one Figure may be interchanged with those of other Figures or other equivalent circuit elements without departing from the spirit of the present teaching.

Figure 1:
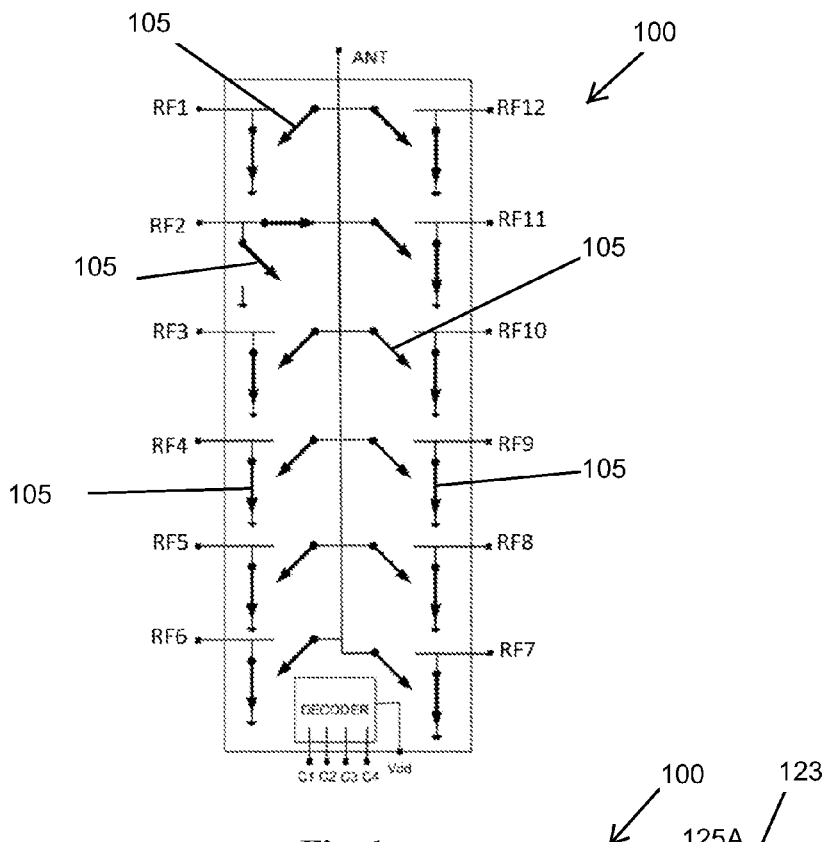
FIG. 1 is a circuit diagram of an exemplary RF switch.
Figure 2:
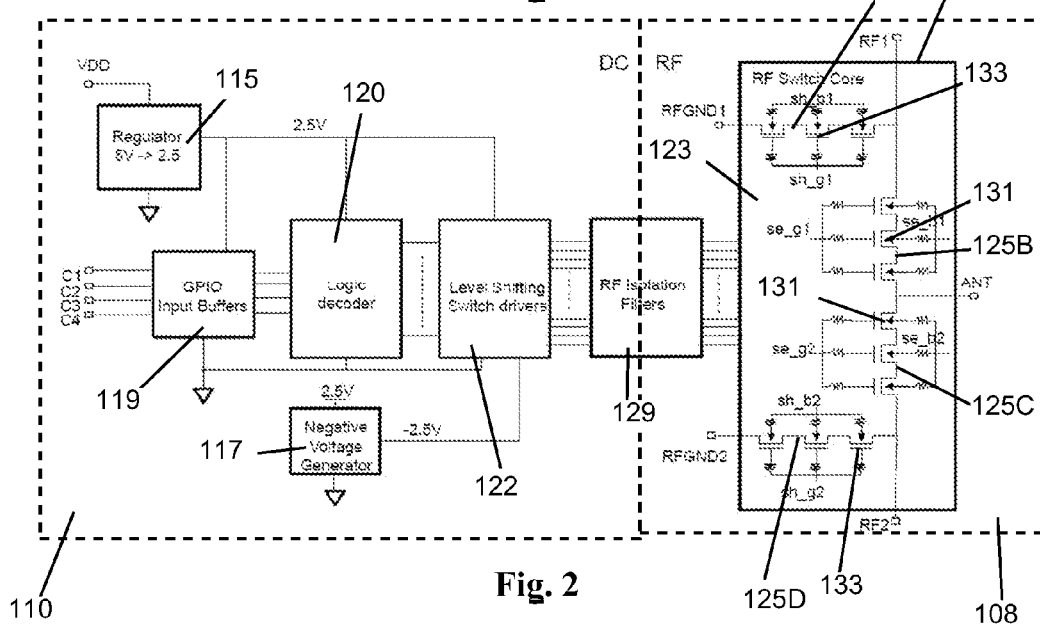
FIG. 2 is a block diagram of an exemplary RF switch.

In advance of describing a radio frequency (RF) switch in accordance with the present teaching an exemplary RF switch 100 is first described with reference to FIGS. 1 to 9. The circuit elements described with reference to the RF switch 100 provide the basic circuit blocks of a traditional RF switch. The RF switch 100 comprises a plurality of switching elements 105 which are operably configured to control the flow of RF power signals between circuit nodes. The RF switch 100 includes two domains; namely, an RF domain section 108 and a direct current (DC) domain section 110 as illustrated in FIG. 2. The DC domain section 110 may comprise one or more digital logic, bias generation, filter, memory, interface, driver and power management circuitry. In the exemplary RF switch 100 the DC domain consists of 5V to 2.5V regulator 115, a negative voltage generator 117, input buffers 119, logic decoder 120 and level-shifting switch drivers 122. These circuits are operably configured to generate the required bias levels, provide power management support and control selection of active switch path through which RF power flows depending on the values set on the control pins C1-C4. Such RF switches are well known in the art.

Figure 3:
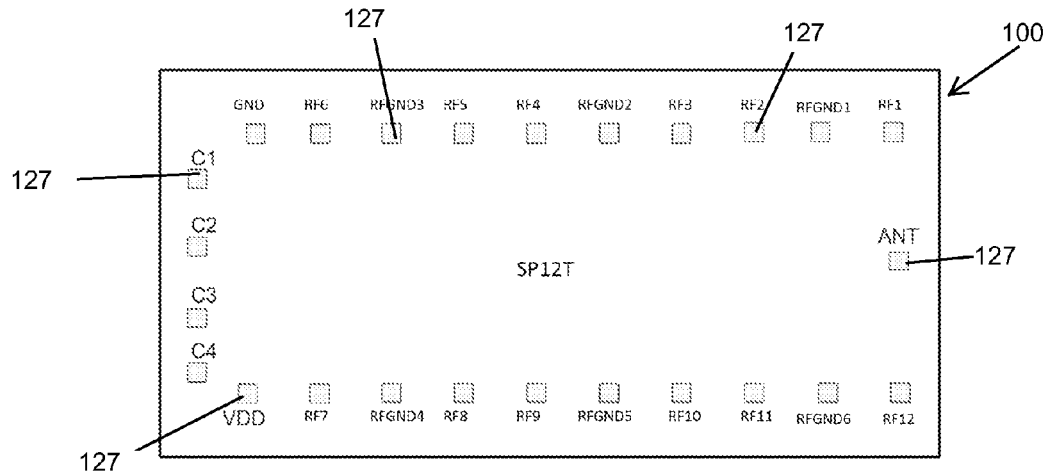
FIG. 3 is a pin out diagram of an exemplary RF switch.

The RF domain section 108 comprises a switch core 123 which in the exemplary arrangement includes two series-shunt switch elements 125A-125D. A plurality of transistors 131, 133 are stacked in the switch elements 125A-125D to divide the RF voltage evenly across the transistors so that the voltage between any two terminals of the individual transistors during operation do not exceed a level that may cause performance degradation or damage to the device. RF isolation filters 129 are placed on signal lines controlling the switch gate and body terminals of the transistors 131,133 at the boundary between the RF domain section 108 and the DC domain section 110. In the exemplary arrangement, the RF switch 100 is provided as single-pole, twelve throw (SP12T) RF switch having input/out pins 127 as illustrated in FIG. 3. A description of the pins 127 is detailed in table 1 below.

TABLE 1

| Pin Name | Description |
|---|---|
| RF1 | RF Port |
| RFGND1 | RF Ground reference for shunt transistor connecting to RF1 & RF2 Ports |
| RF2 | RF Port |
| RF3 | RF Port |
| RFGND2 | RF Ground reference for shunt transistor connecting to RF3 & RF4 Ports |
| RF4 | RF Port |
| RF5 | RF Port |
| RFGND3 | RF Ground reference for shunt transistor connecting to RF5 & RF6 |
| RF6 | RF Port |
| GND | Ground reference for DC domain |
| C1 | Control input, C1-C4 decoded to select which of RF1-RF12 to ANT paths is active |
| C2 | Control input, C1-C4 decoded to select which of RF1-RF12 to ANT paths is active |
| C3 | Control input, C1-C4 decoded to select which of RF1-RF12 to ANT paths is active |
| C4 | Control input, C1-C4 decoded to select which of RF1-RF12 to ANT paths is active |
| VDD | Supply Voltage for DC domain |
| RF7 | RF Port |
| RFGND4 | RF Ground reference for shunt transistor connecting to RF7 & RF8 |
| RF8 | RF Port |
| RF9 | RF Port |
| RFGND5 | RF Ground reference for shunt transistor connecting to RF9 & RF10 |
| RF10 | RF Port |
| RF11 | RF Port |

TABLE 1-continued

| Pin Name | Description |
|---|---|
| RFGND6 | RF Ground reference for shunt transistor connecting to RF11 & RF12 |
| RF12 | RF Port |
| ANT | Antenna Port, RF Common Port |

Figure 4:
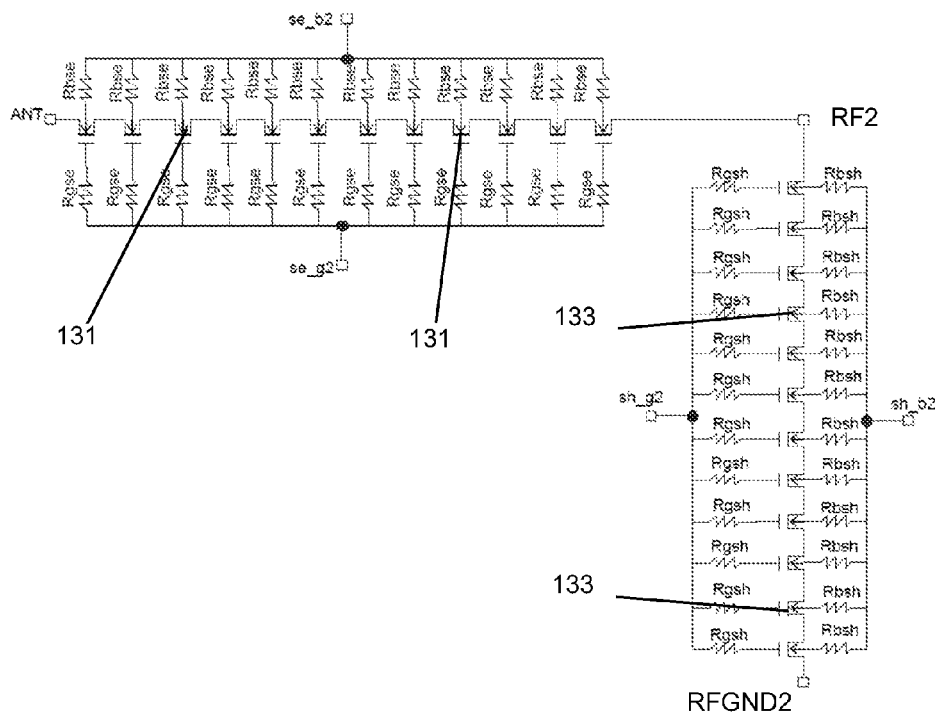
FIG. 4 is a schematic circuit diagram of a detail of the RF switch of FIG. 2.

FIG. 4 shows more detail of the switch core 123 of FIG. 2. The switch core 123 includes a plurality of series transistor elements 131 and a plurality of shunt transistor elements 133. The series transistor elements 131 are in a stacked configuration operably coupled between the antenna node ANT and the RF2 node. The shunt transistor elements 133 are in a stacked configuration operably coupled between the RF2 node and RFGND2 node. The number of transistors in a stack is determined by the maximum RF voltage level that can be experienced on the RF nodes when the switch is operational. A stack of 10-13 transistor devices is common for maximum RF voltages that may be experienced at GSM transmit power levels.

Figure 5:
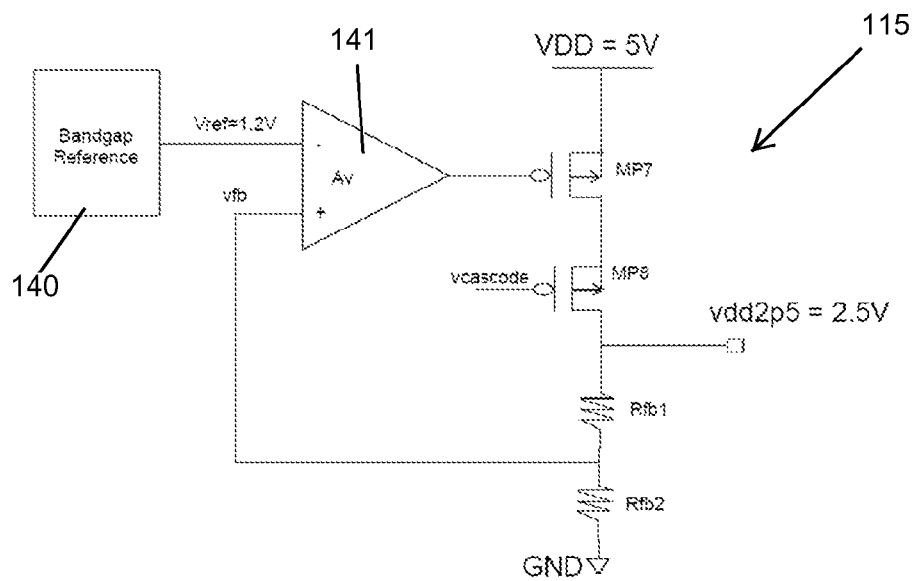
FIG. 5 is a schematic circuit diagram of a detail of the RF switch of FIG. 2.

The voltage regulator 115 of the switch 100 is illustrated in more detail in FIG. 5. The voltage regulator 115 comprises a bandgap reference 140 operably coupled to an input terminal of an op-amp 141. A pair of mosfet transistors MP7, MP8 and a pair of resistors Rfb1, Rfb2 are stacked between a VDD node and a ground reference node. The output from the op-amp 141 drives the MP7 transistor. The gate of the MP8 transistor is operably coupled to a reference voltage source vcascode. A feedback loop is provided from a node intermediate Rfb1 and Rfb2 and an input terminal to the op-amp 141. The voltage regulator 115 is configured to provide a regulated voltage level at a node Vdd2p5. In the exemplary arrange the voltage at the node vdd2p5 is +2.5V.

Figure 6:
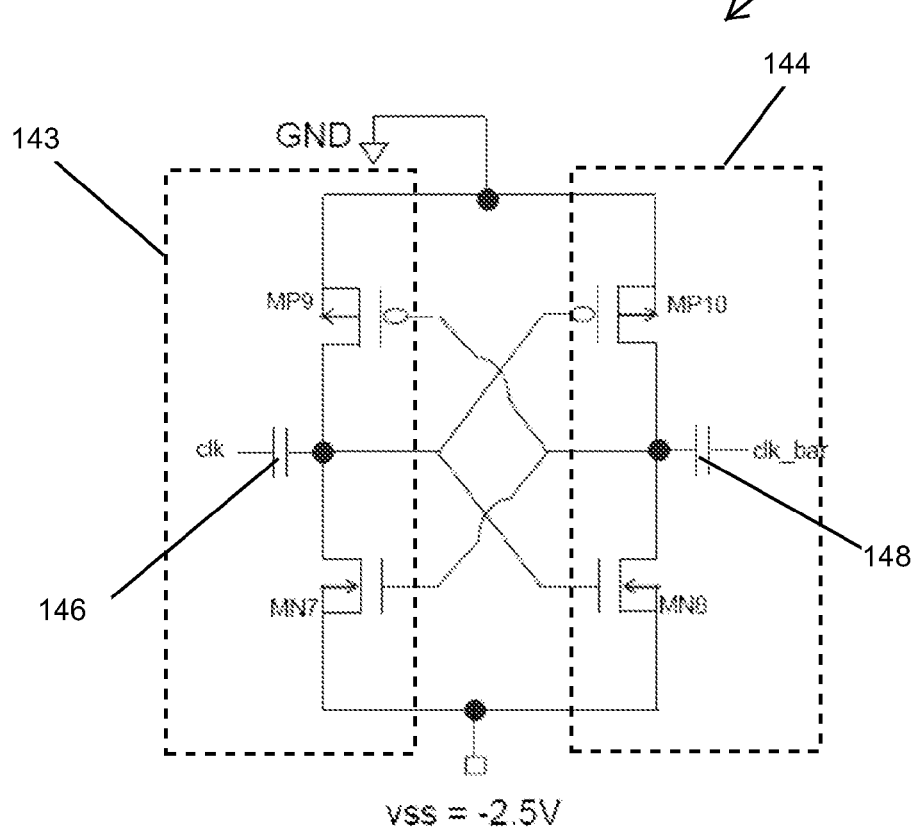
FIG. 6 is a schematic circuit diagram of a detail of the RF switch of FIG. 2.

The negative voltage generator 117 of the switch 100 is illustrated in more detail in FIG. 6. The negative voltage generator 117 comprises a first segment 143 and a second segment 144. The first and second segments 143, 144 are operably coupled between a ground reference node GND and a vss node. The first segment 143 comprises a PMOS transistor MP9 stacked on an NMOS transistor MN7. A first capacitor 146 which receives a clock signal clk is coupled intermediate MP9 and MN7. The second segment 144 comprises a PMOS transistor MP10 stacked on an NMOS transistor MN8. A second capacitor 148 which receives an inverse clock signal clk_bar is coupled intermediate MP10 and MN8. The gates of MP9 and MN7 are driven by the inverse clock signal clk_bar. The gates of MP10 and MN8 are driven by the clock signal clk. The negative voltage generator 117 is configured to provide a negative voltage at the node vss. In the exemplary arrangement the negative voltage which is provided at node vss is −2.5V.

Figure 7:
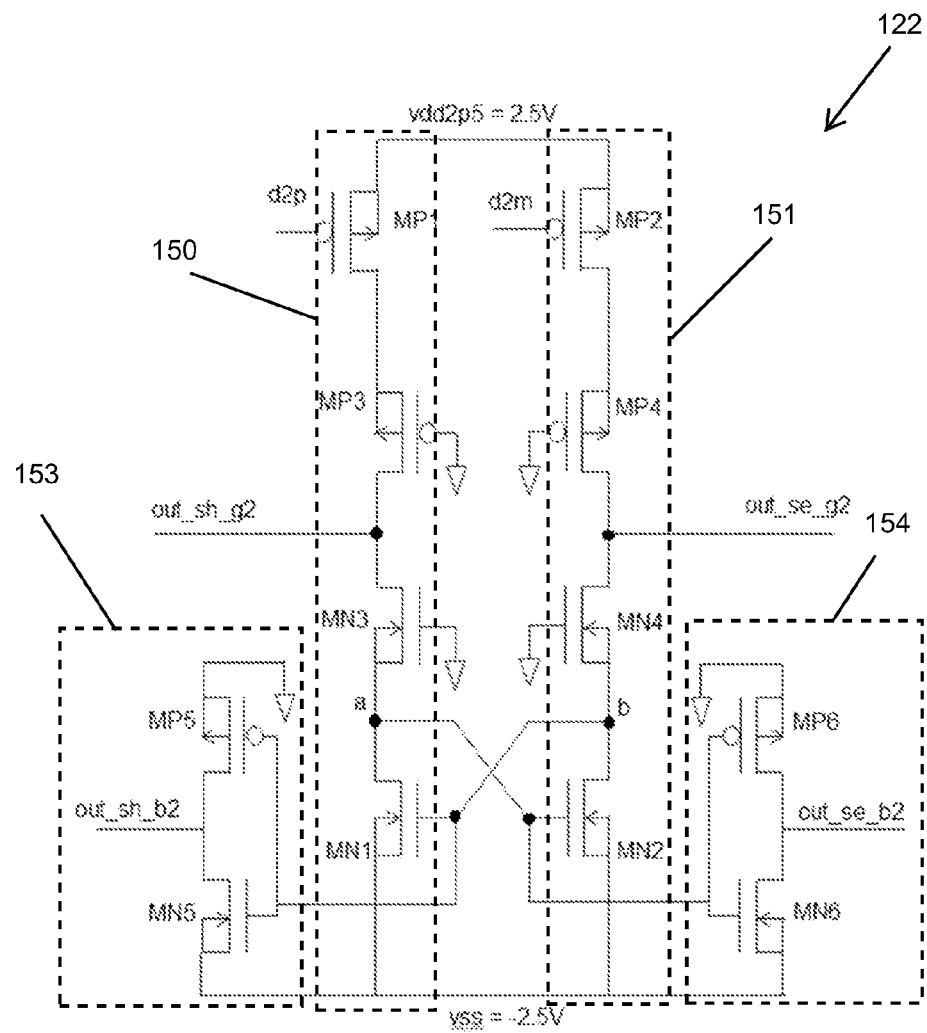
FIG. 7 is a schematic circuit diagram of a detail of the RF switch of FIG. 2.

The level shifting switch driver 122 of the switch 100 is illustrated in more detail in FIG. 7. The switch driver 122 comprises a first switch segment 150 and a second switch segment 151, which are operably coupled between the vdd2p5 node of the 5V-2.5V regulator 115 and the negative voltage node vss of the negative voltage generator 117. In the exemplary arrangement, the first switch segment 150 comprises a pair of PMOS transistors MP1 and MP3 and a pair of NMOS transistors MN3 and MN1. The second switch segment 151 comprises a pair of PMOS transistors MP2 and MP4 and a pair of NMOS transistors MN4 and MN2. The first switch segment 150 is associated with a first CMOS inverter 153 that includes a PMOS transistor MP5 and an NMOS transistor MN5 operably coupled between the vss node and a ground node. The second switch segment 151 is associated with a second CMOS inverter 154 that includes a PMOS transistor MP6 and an NMOS transistor MN6 operably coupled between the vss node and a ground node. The level shifting switch driver 122 is configured to provide four output drive signals which are outputted at nodes out_sh_g2, out_sh_b2, out_se_g2 and out_se_b2. These drive signals are then filtered by the RF isolation filters 129 and the filtered versions of the signals are used to drive the series-shunt switch elements 125A-125D in the switch core 123 of the RF section 108.

Figure 8:
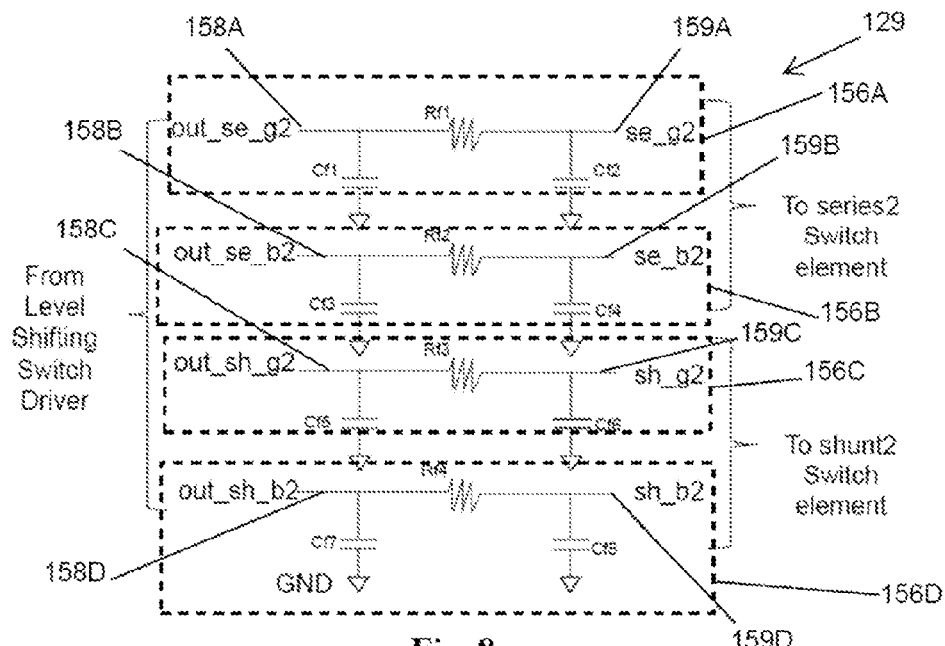
FIG. 8 is a schematic circuit diagram of a detail of the RF switch of FIG. 2.

The RF isolation filters 129 of the switch 100 are illustrated in more detail in FIG. 8. The RF isolation filters 129 are provided in an interface section operably between the DC domain section 110 and the RF domain section 108. In the exemplary arrangement, four filter segments 156A-156D are provided. For brevity, only the filter segment 156A is described. However, it will be appreciated by those of ordinary skill in the art that each of the filter segments 156B to 156D operates in a similar fashion to the filter segment 156A. The filter segment 156A includes a pair of capacitors Cf1 and Cf2 with a resistor Rf1 operably coupled there between. An input node 158A and an output node 159A are provided at respective opposite ends of the resistor Rf1. The capacitors Cf1 and Cf2 each have a first terminal coupled to a ground node. The second terminal of the capacitor Cf1 is coupled to the input node 158A, and the second terminal of the capacitor Cf2 is coupled the output node 159A. The input node 158A receives a drive signal from the node out_se_g2 of the level shifting switch drivers 122 and the output node 159 provides a filtered signal from the node se_g2 which drives the gate terminals of the series switch element 125C in the RF switch core 123 of FIG. 2. Thus the signal from node se_g2 is a filtered representation of the signal from node out_se_g2. In the exemplary arrangement, the filter segment 156B outputs a filtered signal from the node se_b2 which is derived from the signal from node out_se_b2. The filtered signal from the node se_b2 is used to drive the body terminals of the series switch element 125C in the RF switch core 123. The filter segment 156C outputs a filtered signal from node sh_g2 that is derived from the signal of node out_sh_g2. The filtered signal from the node sh_g2 drives the gate terminals of the shunt switch element 125D in the RF switch core 123. The filter segment 156D outputs a filtered signal from the node sh_b2 which is derived from the signal of node out_sh_b2. The filtered signal from the node sh_b2 drives the body terminals of the shunt switch element 125D in the RF switch core 123.

Figure 9:
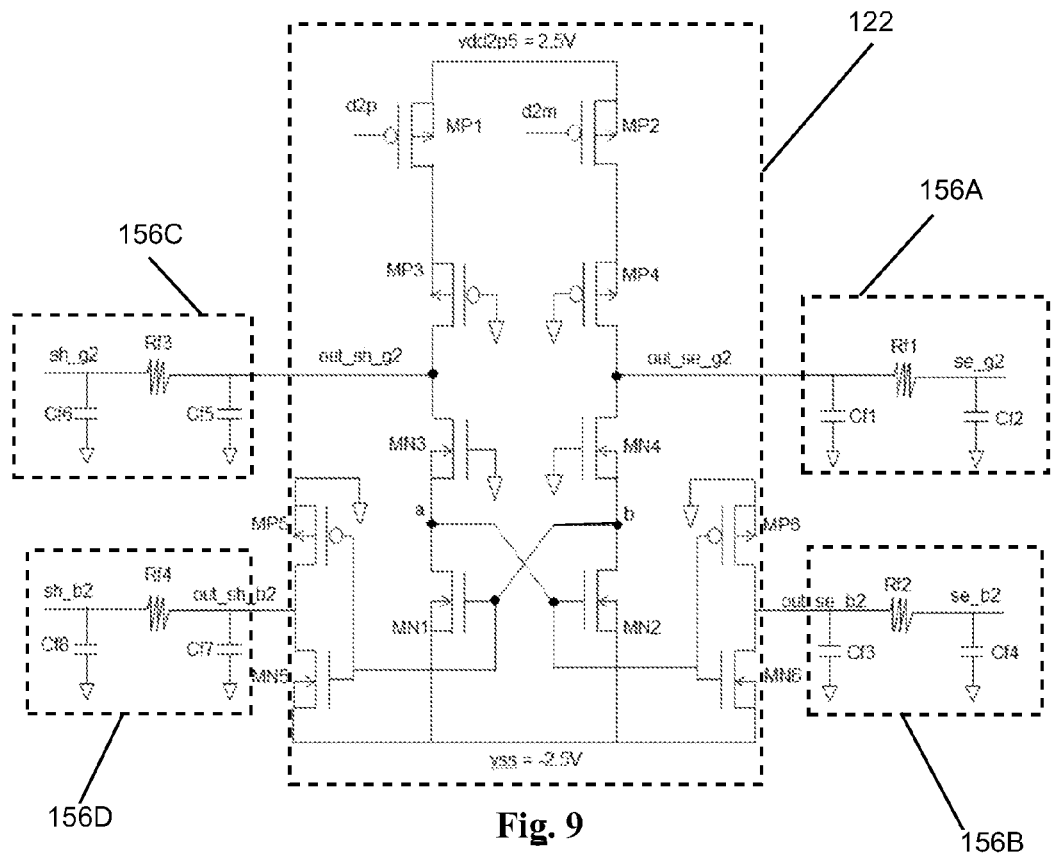
FIG. 9 is a schematic circuit diagram of a detail of the RF switch of FIG. 2.
Figure 10:
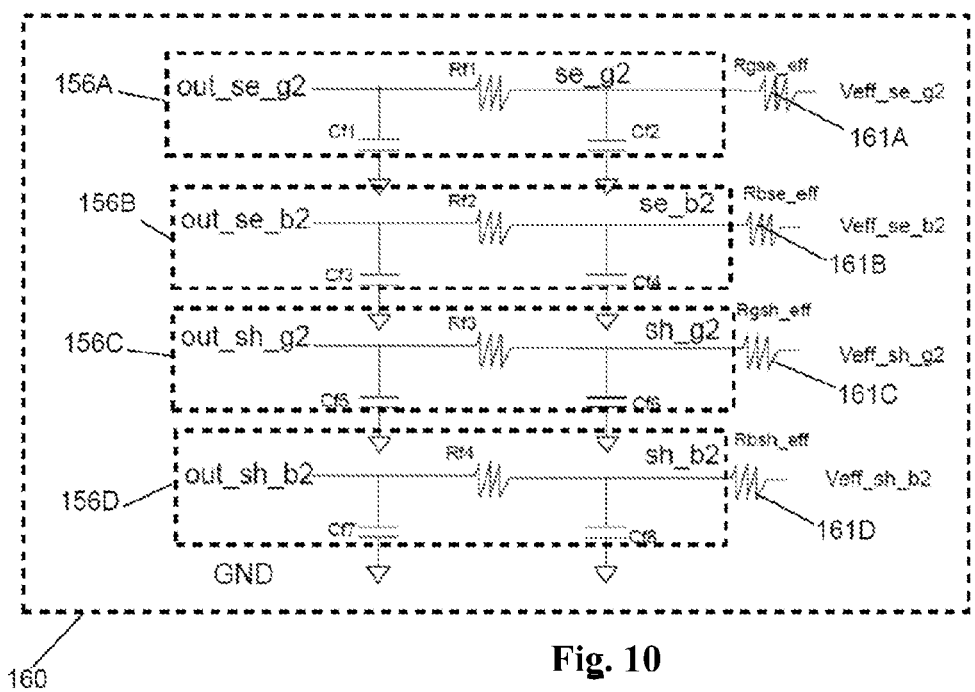
FIG. 10 is an equivalent circuit of the RF isolation filters of FIG. 8.

FIG. 9 illustrates the RF isolation filters 156A-156D operably coupled to the output nodes of the level shifting switch drivers 122. The schematic of FIG. 9 combines the circuit diagrams of FIGS. 7 and 8. An equivalent circuit 160 of the interface between the DC domain section 110 and the RF domain section 108 is illustrated in FIG. 10. The circuit 160 is substantially similar to the circuit of FIG. 8 and like components are indicated by similar reference numerals. An additional resistor element 161 is provided on each filter segment 156 which represents the effective resistance connecting to the gate and body terminals of the transistor elements 131, 133 in the RF switch core 123 of FIG. 2. Consider for example the top filter segment 156A between nodes out_se_g2 and se_g2. To turn on a transistor 131, 133 in the switching core 123 the voltage at the gate terminal of the transistor, Veff_se_g2 must transition from its low state, −2.5V, to high state, +2.5V.

Figure 11:
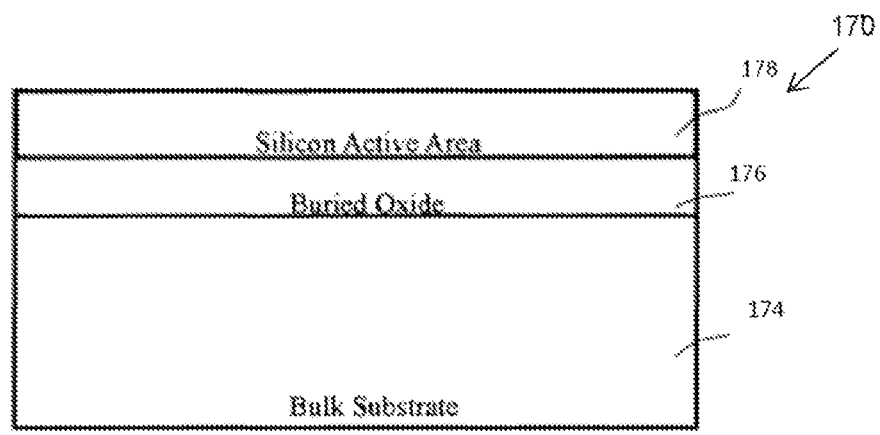
FIG. 11 is a cross sectional side view of a silicon-on-insulator structure on which the RF switch of FIG. 2 may be fabricated thereon.

Referring now to FIG. 11 which illustrates a typical silicon-on-insulator (SOI) structure 170 on which the RF switch 100 may be fabricated thereon. In the exemplary arrangement, an insulating layer sits on top of a silicon substrate. A typical material for the insulating layer is silicon dioxide. In general SOI technologies consist of a bulk substrate 174, a buried oxide layer 176 and a thin active silicon layer 178. The bulk substrate 174 is generally a high resistivity substrate. The bulk substrate 174 can be either P-type or N-Type. A typical thickness for the bulk substrate is 250 μm. The buried oxide layer 176 is an insulator layer, typically silicon dioxide. A typical thickness of the buried oxide layer 176 is 1 μm. The active silicon layer 178 above the buried oxide layer 176 is typically of the order of 0.2 μm. The RF switch 100 may be fabricated in the silicon active area 178 using semiconductor processing techniques that are well known in the art and may include for example, but not limited to, deposition, implantation, diffusion, patterning, doping, and etching. The RF domain section 108 and the DC domain section 110 of the RF switch 100 are typically fabricated on a single semiconductor structure.

Distortion may arise due to non-linear impedances within transistors themselves and within the stacked transistor arrangement in the switch core 123. The impedance of a non-linear element is a function of the voltage difference across the element. The resulting current can be expressed as a power series of the form:

$$i = a_0 + a_1 \cdot v + a_2 \cdot v^2 + a_3 \cdot v^3 + \quad \text{Equation 1}$$

Where:
i is current flowing through non-linear impedance,
v is voltage difference across non-linear impedance element; and
$a_n = \{a_0, a_1, a_2, a_3, \ldots\}$ are $n^{th}$ order conductance coefficients.

In general for RF systems $2^{nd}$ and $3^{rd}$ order distortion is of most concern but the power series of Equation 1 may be continued to higher orders of n. For the case where voltage difference, v, is a single tone of amplitude k, at frequency f, i.e.

$$v = k \cdot \cos(2\pi f t) \quad \text{Equation 2}$$

the $a_n$ terms result in $n^{th}$ harmonic components in output current at multiples of n-times the fundamental frequency.

In a four terminal MOSFET transistor the current flowing through the channel from the drain to the source terminal is a function of the voltage difference between each of the four terminals and all the other terminals.

$$ids = f(v_{ds}, v_{dg}, v_{gs}, v_{db}, v_{bs}, v_{gb}) \quad \text{Equation 3}$$

Where:
ids=current from drain to source,
vds=drain to source voltage,
vdg=drain to gate voltage,
vgs=gate to source voltage,
vdb=drain to body voltage,
vbs=body to source voltage, and
vgb=gate to body voltage.

Each of the six inter-terminal voltage differences listed in Equation 3 influences the channel current in a non-linear fashion. Consequently each of the six inter-terminal voltage differences contributes to harmonic components in the channel current flowing from drain to source. Equation 1 can therefore be expanded into six individual equations representing current terms due to each of the inter-terminal voltages.

$$ids_i = a_{i0} + a_{i1} \cdot v_i + a_{i2} \cdot v_i^2 + a_{i3} \cdot v_i^3 + \quad \text{Equation 4}$$

Where:

i=1, 2, 3, 4, 5, 6 is the index representing each of inter-terminal voltages such that:
  $v_1$=drain to source voltage, $v_{ds}$,
  $v_2$=drain to gate voltage, $v_{dg}$,
  $v_3$=gate to source voltage, $v_{gs}$,
  $v_4$=drain to body voltage, $v_{db}$,
  $v_5$=body to source voltage, $v_{bs}$,
  $v_6$=gate to body voltage, $v_{gb}$,
  $ids_i$, is the drain to source current contribution due to each of inter-terminal voltages, $v_1$-$v_6$, and
  $a_{in}$=$n^{th}$ order conductance coefficient.

Equation 4 may be explicitly expressed below for each of the six inter-terminal voltage contributors to channel current.

$$ids_1 = a_{10} + a_{11} \cdot v_{ds} + a_{12} \cdot v_{ds}^2 + a_{13} \cdot v_{ds}^3 + \quad \text{Equation 4a}$$

$$ids_2 = a_{20} + a_{21} \cdot v_{dg} + a_{22} \cdot v_{dg}^2 + a_{23} \cdot v_{dg}^3 + \quad \text{Equation 4b}$$

$$ids_3 = a_{30} + a_{31} \cdot v_{gs} + a_{32} \cdot v_{gs}^2 + a_{33} \cdot v_{gs}^3 + \quad \text{Equation 4c}$$

$$ids_4 = a_{40} + a_{41} \cdot v_{db} + a_{42} \cdot v_{db}^2 + a_{43} \cdot v_{db}^3 + \quad \text{Equation 4d}$$

$$ids_5 = a_{50} + a_{51} \cdot v_{bs} + a_{52} \cdot v_{bs}^2 + a_{53} \cdot v_{bs}^3 + \quad \text{Equation 4e}$$

$$ids_6 = a_{60} + a_{61} \cdot v_{gb} + a_{62} \cdot v_{gb}^2 + a_{63} \cdot v_{gb}^3 + \quad \text{Equation 4f}$$

The overall current flowing from drain to source may be expressed as sum of current contributions due to each of inter-terminal voltages.

$$ids = ids_1 + ids_2 + ids_3 + ids_4 + ids_5 + ids_6 \quad \text{Equation 5}$$

In the case where the current flowing from drain to source is coupled to a load in an RF system it can be seen that the harmonic components in the channel current result in the generation of power at harmonics of the fundamental frequency.

For a given technology $a_{in}$ coefficients are fixed by process parameters and minimum distortion conditions for each of six inter-terminal voltages can be determined from Equations 4a-4f. In the presence of an RF signal that is divided across the transistor stack resulting in an RF voltage between the drain and source terminals, vds, it follows that all the other inter-terminal voltages cannot simultaneously be zero. Minimum distortion occurs when the amplitude of $v_{dg}$, $v_{gs}$, $v_{db}$ and $v_{bs}$ are simultaneously at minima which can only occur when the drain to source RF voltage is symmetrically divided on gate and body:

$$v_{dg} = v_{gs} = v_{db} = v_{bs} = \frac{v_{ds}}{2} \quad \text{Equation 6}$$

In this ideal case it follows that RF signal at gate and body terminals must be equal so that:

$$v_{gb} = 0 \quad \text{Equation 7}$$

Existing approaches known heretofore target approximately symmetrical division of RF voltage on gate and body with respect to the drain and source to increase the compression point that may be achieved when the transistors are stacked. The present teaching identifies fundamental sources of asymmetry in the stacked transistors and provides circuit configurations in order to reduce or eliminate the effect of such asymmetry thereby improving the linearity performance of RF transistor stack.

Figure 12:
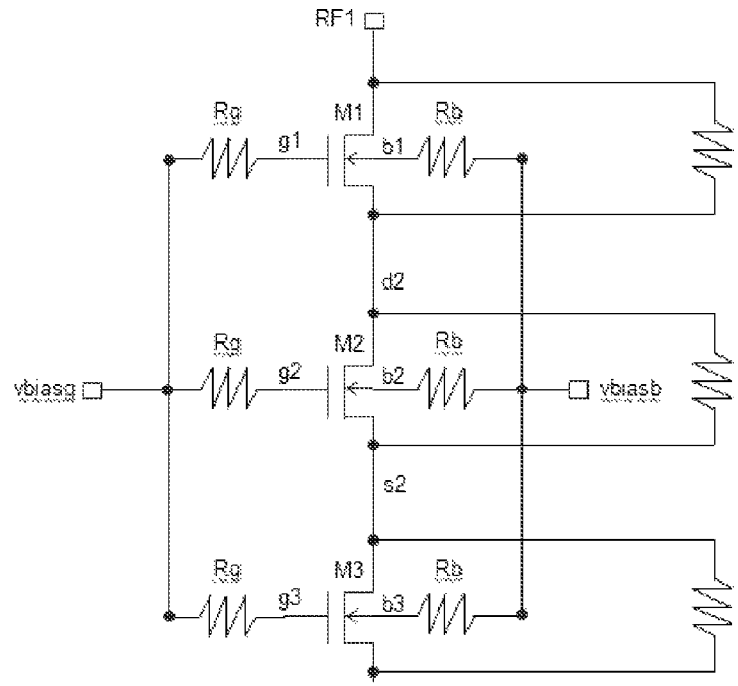
FIG. 12 is a schematic circuit diagram of an exemplary RF switch element.

FIG. 12 illustrates an exemplary RF transistor stack configuration. A stack of three body-contacted transistors M1-M3 are shown for illustration but the number of transistors stacked will depend on maximum RF voltage that may be developed between the RF1 port and the RF2 port. The gate terminal of each transistor M1-M3 is connected to a common bias point, vbiasg, through resistor, Rg. The body terminal of each transistor M1-M3 is connected to a common bias point, vbiasb, through resistor, Rb. In transistor stack arrangments know heretofore the values of gate and body resistors are chosen such that the RC time constant formed by the coupling capacitances from the drain and source to the gate and body is larger than the inverse of the operating RF frequency so that the RF voltage is divided approximately equally across each of the transistors. Such an arrangmenet increases the compression point of the structure.

RF1 and RF2 are the ports where the RF signal is input or output. The RF signal at a port is around the DC bias point of 0V. When the transistor stack is in an on-state the common gate bias point, vbiasg, is set to a positive value in excess of the threshold voltage, for example, vbiasg=2.5V. In the on-state the common body bias, vbiasb, point is set to be equal to the drain and source DC bias value of 0V. When transistor stack is in off-state the common gate bias point, vbiasg, and common body bias point, vbiasb, are set to a negative value to ensure transistors remain off in the presence of RF voltage, e.g. vbiasg=−2.5V, vbiasb=−2.5V. High resistance drain to source bias resistors, Rds, are included to provide DC bias of 0V to the drain and source terminals of transistors in stack when the transistors are in off-state. It will be appreciated by those of ordinary skill in the art that the bias voltages are given by way of example only.

Figure 13A:
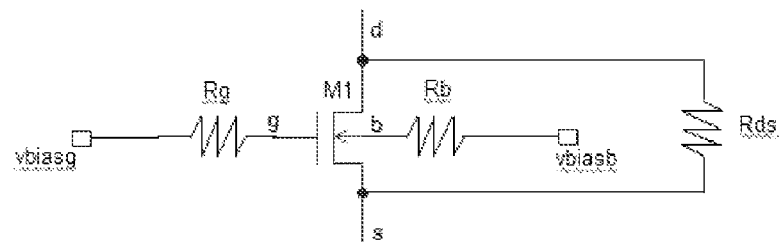
FIG. 13A is a schematic circuit diagram of a detail of the RF switch element of FIG. 12.

FIG. 13A shows the circuit arrangement for one transistor element in the stack. For brevity, only a single transisor of the stack is described. However, it will be appreciated by those of ordinary skill in the art that each of the other transistor M2-M3 will operate in a similar fashion to the transistor M1. Transistor, M1, has a drain terminal, d, and a source terminal, s. The gate terminal of M1, g, is connected to a common bias point, vbiasg, through resistor, Rg. The body terminal of M1, b, is connected to a common bias point, vbiasb, through resistor, Rb. High resistance drain to source bias resistors, Rds, are included to provide DC bias of 0V to drain and source terminals when transistor is in off-state.

Figure 13B:
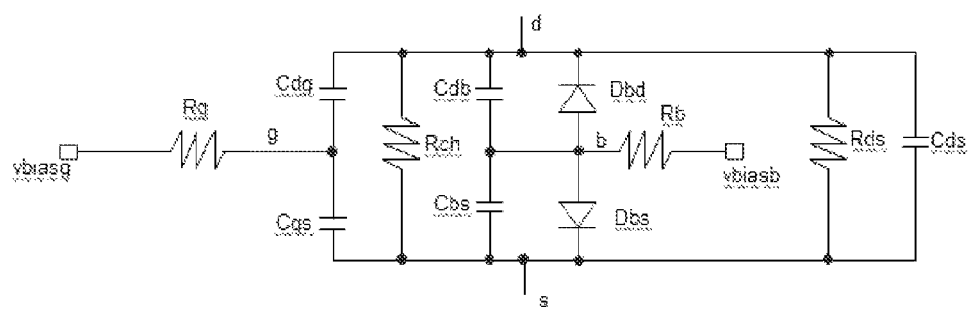
FIG. 13B is a schematic circuit diagram of a detail of the RF switch element of FIG. 12.

FIG. 13B shows a simplified model for one of the transistor elements in the transistor stack. The literature different model is often shown for transistor depending on whether it is biased in an on-state or off-state. A single model for both states is shown here that illustrates asymmetry sources. Transistor M1 is replaced by a simplified model for the channel resistance, Rch, and parasitic elements. In the on-state the channel resistance is low and is the main contributor to providing impedance between drain and source. In the off-state the channel resistance is high, ideally infinite, and parasitic elements are the main contributors to providing impedance between the drain and source. Intrinsic parasitic elements related to the gate terminal consist of capacitance between the drain and gate, Cdg, and capacitance between the gate and source, Cgs. These capacitances are due both to inherent device capacitance and interconnect capacitance due to routing on the physical layout. Parasitic elements related to the body terminal consist of capacitance between drain and body, Cdg, and the capacitance between the body and source, Cbs. These capacitances are due both to inherent device capacitance and interconnect capacitance due to the routing on the physical layout. Parasitic diodes between the body and drain, Dbd, and the body and source, Dbs, contribute to inherent device capacitance. Parasitic capacitance between the drain and source, Cds, is also included. This parasitic is made up of inherent device capacitance and interconnect capacitance due to routing on the physical layout. This parasitic does not contribute to the asymmetry of inter-terminal voltage on the single transistor element but may contribute to an unequal division of the RF signal through the stacked arrangement. Imbalance in the impedance from the drain to gate, Zdg, and gate to source, Zgs, results in an unequal division of the the RF drain to source voltage, vds, between the drain to gate, vdg, and gate to source, vgs. Imbalance in the impedance from drain to body, Zdb, and the body to source, Zbs, results in unequal division of the RF drain to source voltage, vds, between drain to body, vdb, and body to source, vbs. The dominant source of imbalance in impedances to the body terminal are diodes Dbd and Dbs. The arrangement of the diodes are asymmetrical because Zdb contains diode oriented N-P and Zbs contains diode oriented P-N. The transistor is fundamentally asymmetrical. There is much less imbalance in the impedances to the gate terminal because the capacitance is largely made up of the oxide capacitance.

Figure 14:
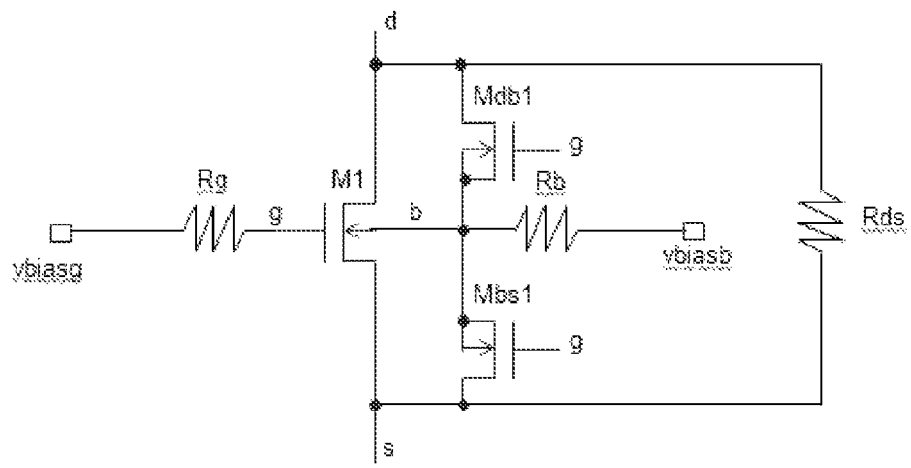
FIG. 14 is a schematic circuit diagram of an RF switch element in accordance with the present teaching.

Referring now to FIG. 14 which illustrates an RF switch element 200 in accordance with the present teaching. The RF switch element 200 is configured to reduce the imbalance in Zdb and Zbs for a single stack element as shown in FIG. 13A. A pair of secondary transistors Mdb1 and Mbs1 are configured to cooperate with the primary stack transistor M1. In the exemplary configuration the gate terminals of Mdb1 and Mbs1 are connected to the gate terminal of M1, g. The body terminals of Mdb1 and Mbs1 are connected to the body terminal of M1, b. The drain terminal of Mdb1 is connected to the drain terminal of M1, d, and the source terminal of Mdb1 is connected to body terminal of M1, b. The drain terminal of Mbs1 is connected to the source terminal of M1, s, and the source terminal of Mbs1 is connected to body terminal of M1, b. With the bias arrangement as shown in FIG. 14, transistors Mdb1 and Mbs1 are in on-state when transistor M1 is in on-state because in this state the DC bias levels are Vg=2.5V, Vb=0V, Vd=0V, Vs=0V and the gate-source voltage on Mdb1 and Mbs1 is 2.5V. When the transistor M1 is in an off-state, transistors Mdb1 and Mbs1 are also in an off-state because in this state the DC bias levels are Vg=−2.5, Vb=−2.5V, Vd=0V, V=0V and gate-source voltage on Mdb1 and Mbs1 is 0V. The secondary transistors Mdb1 and Mbs1 provide signal paths having impedance levels that are significantly lower and more linear than the impedance of the intrinic diodes Zdb and Zbs of transistor M1 when biased in the on-state. As a result there is less asymmetry in the division of RF drain to source voltage, vds, between drain to body, vdb, and body to source, vbs. Harmonic current components, $ids_4$ and $ids_5$, described in Equations 4d and 4e are reduced accordingly. The secondary transistors Mdb1 and Mbs1 present high impedance in an off-state allowing offset in DC bias voltage between node b, −2.5V, and nodes d and s, 0V. It will be appreciated by those of ordinary skill in the art that the bias voltages are given by way of example only, and it is not intended to limit the present teaching to the exemplary values described herein.

In the off-state the dominant source of imbalance in impedances to the body terminal are diodes Dbd and Dbs. The arrangement of the diodes is asymmetrical because Zdb contains diode oriented N-P and Zbs contains diode oriented P-N. However compared to the on-state there is less imbalance in capacitance due to body diodes because the reverse bias on the diodes in this state is −2.5V. There is much less imbalance in the impedances to gate terminal because the capacitance is largely made up of oxide capacitance.

Figure 15:
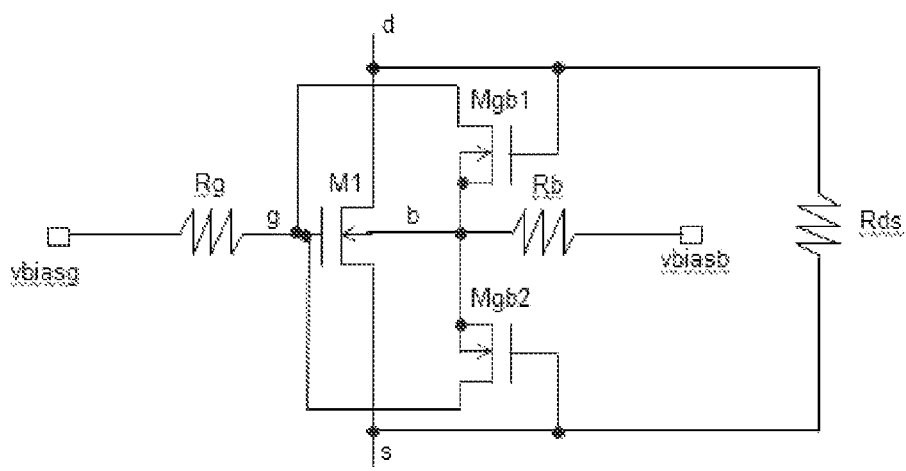
FIG. 15 is a schematic circuit diagram of an RF switch element in accordance with the present teaching.

Referring now to FIG. 15 which illustrates an RF switch element 300 which is also in accordance with the present teaching. The RF switch element 300 is configured to reduce imbalance in Zdb and Zbs for a single stack element shown in FIG. 13A. A pair of transistors Mgb1 and Mgb2 are configured to co-operate with the primary stack transistor M1. The gate terminal of Mgb1 is connected to the drain terminal of M1, d. The gate terminal of Mgb2 is connected to the source terminal of M1, s. The body terminals of Mgb1 and Mgb2 are connected to the body terminal of M1, b. Drain terminals of Mgb1 and Mgb2 are connected to gate terminal of M1, g, and source terminals of Mgb1 and Mgb2 are connected to body terminal of M1, b. With the bias arrangement as shown in FIG. 15, transistors Mgb1 and Mgb2 are in an on-state when the transistor M1 is in an off-state because in this state the DC bias levels are Vg=2.5V, Vb=0V, Vd=0V, Vs=0V and the gate-source voltage on the Mgb1 and Mgb2 is 2.5V. When the transistor M1 is in an on-state, transistors Mgb1 and Mgb2 are in an off-state because in this state the DC bias levels are Vg=−2.5, Vb=−2.5V, Vd=0V, V=0V and the gate-source voltage on Mgb1 and Mgb2 is −2.5V. Transistors Mgb1 and Mgb2 reduce the impedance between the gate and body terminal of M1 when M1 is biased in the off-state. The resulting impedances, Zdb and Zbs are significantly lower and more linear than would be the case without the addition of Mgb1 and Mgb2. As a result there is less asymmetry in the division of RF drain to source voltage, vds, between drain to body, vdb, and body to source, vbs. The RF voltage between the gate and body, vgb, is also reduced. Harmonic current components, $ids_4$, $ids_5$ and $ids_6$, described in Equations 4d, 4e and 4f are reduced accordingly. Transistors Mgb1 and Mgb2 present high impedance in the off-state allowing offset in the DC bias voltage between node b, 0V, and node g, 2.5V. It will be appreciated by those of ordinary skill in the art that the bias voltages are given by way of example only, and it is not intended to limit the present teaching to the exemplary values described herein.

Figure 16:
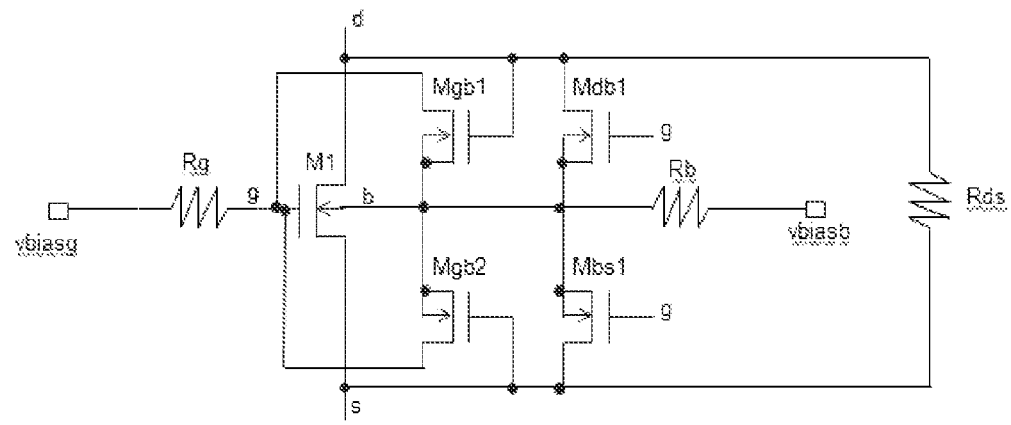
FIG. 16 is a schematic circuit diagram of an RF switch element in accordance with the present teaching.
Figure 17:
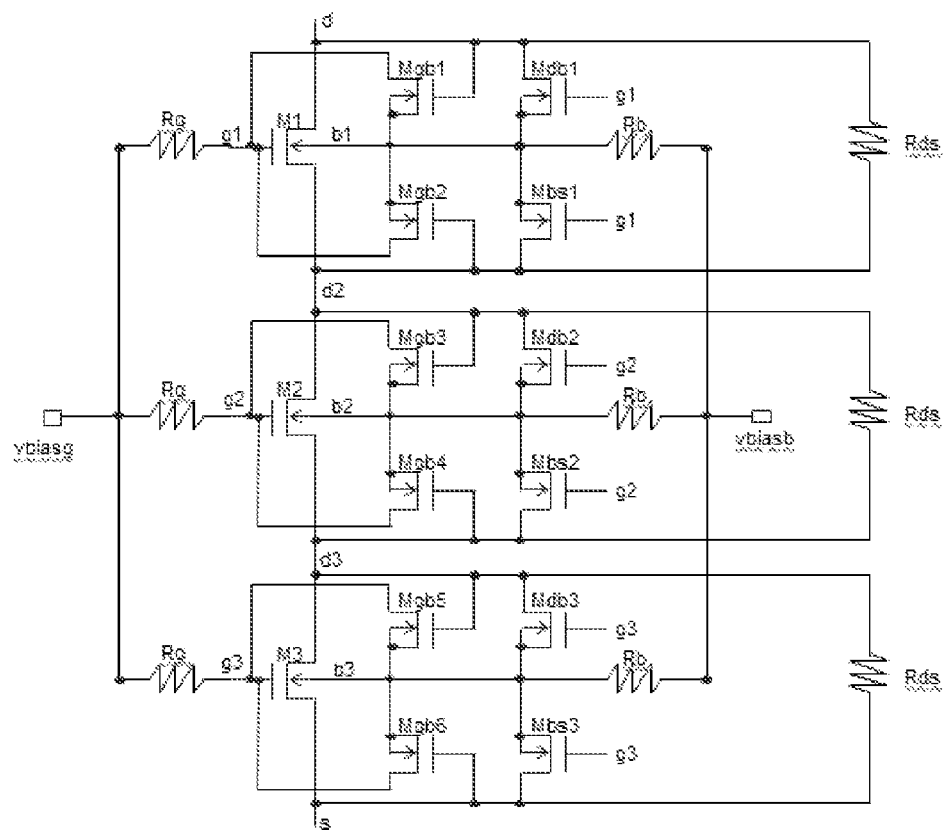
FIG. 17 is a schematic circuit diagram of a stack of RF switch elements in accordance with the present teaching.
Figure 18:
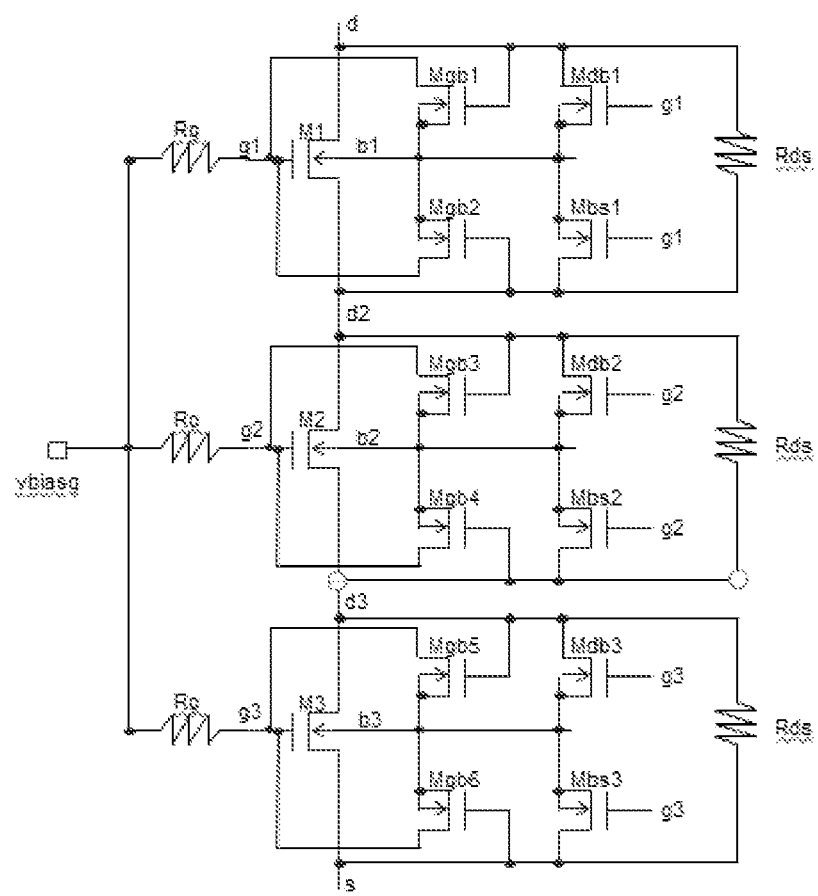
FIG. 18 is a schematic circuit diagram of a stack of RF switch elements in accordance with the present teaching.

Referring now to FIG. 16 which illustrates an RF switch element 400 which includes the circuit elements of FIGS. 14 and 15, and is also in accordance with the present teaching. The RF switch element 400 includes both circuit enhancements to reduce asymmetry in the on-state, Mdb1 and Mbs1, and to reduce the asymmetry in off-state, Mgb1 and Mgb2. Thus the RF switching element 400 incorporates the advantages of the RF switching elements 200 and 300 which are described above in detail. FIG. 17 shows a stack of three body-contacted transistors with circuit enhancements to reduce asymmetry of main stack transistors M1-M3 in the on-state, Mdb1-3 and Mbs1-3, and to reduce asymmetry of main stack transistors M1-M3 in off-state, Mgb1-6. The circuit configuration of FIG. 18 is substantially similar to the circuit configuration of FIG. 17 with the exception that the common bias point and the bias resistors Rg and Rb that are associated with the body terminals of M1-M3 are eliminated. The main stack transistors M1-M3 are body contacted devices where the DC bias voltage level applied to the body terminals depends on the state of the transistor. In the on-state the DC bias voltage applied to the body terminal is 0V. In the off-state the DC bias voltage applied to the body terminal is −2.5V. In the prior art arrangement of FIG. 2 these DC bias voltage levels are generated in the level shifting switch driver 122 and applied through bias resistors to the body terminals of the stacked transistors in the switch core 123. In the embodiment of FIG. 18 DC the bias voltage level of 0V at the main stack transistors' drain and source terminals is applied to the main stack transistors' body terminals through the transistors Mdb1-3 and Mbs1-3 when the main stack transistors M1-M3 are in the on-state. A DC bias voltage level of −2.5V at the main stack transistors' gate terminal is applied to body terminal through transistors Mgb1-6 when the main stack transistor is in the off-state. This eliminates the need to supply independent body bias and allows the body driver and bias resistors to the body terminals of the stacked transistors to be eliminated. This saves circuit area and reduces the number of bias signals that have to be routed from the level shifting switch drivers in the DC domain to the switch elements in the RF domain which increases isolation by increasing distance between routing traces.

The advantages of the present teaching are many. It will be appreciated by those of ordinary skill in the art that the RF switch element of the present teaching has an improved transistor stack linearity. In particular, the RF switch element of the present teaching reduces sources of distortion thereby increasing linearity performance. While the present teaching has been described with reference to exemplary arrangements and circuits it will be understood that it is not intended to limit the teaching of the present teaching to such arrangements as modifications can be made without departing from the spirit and scope of the present invention. In this way it will be understood that the present teaching is to be limited only insofar as is deemed necessary in the light of the appended claims.

Similarly the words comprises/comprising when used in the specification are used to specify the presence of stated features, integers, steps or components but do not preclude the presence or addition of one or more additional features, integers, steps, components or groups thereof.

I claim:

1. A radio frequency (RF) switch element comprising:
    a primary transistor element coupled between a pair of RF ports for switching an RF signal between the pair of RF ports; and
    a pair of secondary transistor elements;
    wherein the pair of secondary transistor elements are co-operable with the primary transistor element and provide respective signal paths which have a lower impedance level than an intrinsic element associated with the primary transistor element; wherein a drain terminal and a source terminal of one of the secondary transistor elements is connected between a gate terminal and a body terminal of the primary transistor element and provides a signal path with an impedance level which is lower than an intrinsic element located between the gate terminal and the body terminal of the primary transistor element.

2. An RF switch element as claimed in claim 1, further comprising a plurality of primary transistor elements arranged in a stacked configuration.

3. An RF switch element as claimed in claim 2, wherein each primary transistor element in the stacked configuration is associated with a pair of secondary transistor elements.

4. An RF switch element as claimed in claim 1, wherein the primary transistor element comprises four terminals.

5. An RF switch element as claimed in claim 4, wherein the respective secondary transistor elements comprise four terminals.

6. An RF switch element as claimed in claim 5, wherein the primary transistor element comprises a gate terminal, a source terminal, a drain terminal and a body terminal.

7. An RF switch element as claimed in claim 6, wherein the respective secondary transistor elements comprise a gate terminal, a source terminal, a drain terminal and a body terminal.

8. An RF switch element as claimed in claim 1, wherein each pair of secondary transistor elements are biased in operation to be in an on-state when the associated primary transistor element is in an off state.

9. An RF switch element as claimed in claim 8, wherein each pair of secondary transistor elements are biased in operation to be in an off-state when the associated primary transistor element is in an on state.

10. An RF switch element as claimed in claim 1, wherein a drain terminal and a source terminal of the other one of the secondary transistor elements is connected between the gate terminal and the body terminal of the primary transistor element and provides a signal path with an impedance level which is lower than an intrinsic element located between the gate terminal and the body terminal of the primary transistor element.

11. An RF switch element as claimed in claim 1, wherein the gate terminal of one of the secondary transistor elements is connected to the drain terminal of the primary transistor element.

12. An RF switch element as claimed in claim 11, wherein the gate terminal of the other one of the secondary transistor elements is connected to the source terminal of the primary transistor element.

13. A radio frequency (RF) switch element comprising:
    a primary transistor element coupled between a pair of RF ports for switching an RF signal between the pair of RF ports; and
    a pair of secondary transistor elements; wherein the pair of secondary transistor elements are co-operable with the primary transistor element and provide respective signal paths which have a lower impedance level than an intrinsic element associated with the primary transistor element; wherein one of the secondary transistor elements is connected between a drain or source terminal and the body terminal of the primary transistor element and provides a signal path with an impedance level which is lower than an intrinsic element located between the drain terminal and the body terminal of the primary transistor element;
    wherein the body terminal of the primary transistor element and the body terminals of both secondary transistor elements are connected together.

14. An RF switch element as claimed in claim 13, wherein each pair of secondary transistor elements and the associated primary transistor element are biased in operation to be simultaneously in an on-state.

15. An RF switch element as claimed in claim 13, wherein each pair of secondary transistor elements and the associated primary transistor element are biased in operation to be simultaneously in an off-state.

16. An RF switch element as claimed in cliam 13, wherein the other one of the secondary transistor elements is connected between the body terminal and the source terminal of the primary transistor element and provides a signal path with an impedance level which is lower than an intrinsic element located between the body terminal and the source terminal of the primary transistor element.

17. An RF switch element as claimed in claim 13, wherein the gate terminal of the primary transistor element and the gate terminals of the pair of secondary transistor elements are connected to a common node.

* * * * *